(12) United States Patent
Frisina et al.

(10) Patent No.: US 8,895,370 B2
(45) Date of Patent: Nov. 25, 2014

(54) VERTICAL CONDUCTION POWER ELECTRONIC DEVICE AND CORRESPONDING REALIZATION METHOD

(71) Applicant: STMicroelectronics S.R.L., Agrate Brianza (IT)

(72) Inventors: Ferruccio Frisina, S. Agata Li Battiati (IT); Giuseppe Ferla, Acicastello (IT); Angelo Magri', Belpasso (IT)

(73) Assignee: STMicroelectronics S.R.L., Agrate Brianza (MB) (IT)

(*) Notice: Subject to any disclaimer, the term of this patent is extended or adjusted under 35 U.S.C. 154(b) by 0 days.

(21) Appl. No.: 14/042,041

(22) Filed: Sep. 30, 2013

(65) Prior Publication Data

US 2014/0045309 A1   Feb. 13, 2014

Related U.S. Application Data

(62) Division of application No. 11/235,495, filed on Sep. 26, 2005, now Pat. No. 8,624,332.

(30) Foreign Application Priority Data

Sep. 30, 2004 (EP) .................... 04425733

(51) Int. Cl.
*H01L 21/332* (2006.01)
*H01L 29/66* (2006.01)
(Continued)

(52) U.S. Cl.
CPC .... *H01L 29/66666* (2013.01); *H01L 29/66712* (2013.01); *H01L 21/26586* (2013.01); *H01L*
(Continued)

(58) Field of Classification Search
CPC .............. H01L 29/41766; H01L 29/7813; H01L 29/0878
USPC ............. 257/E21.345, E29.026, E29.027, 257/E29.113–E29.115, E29.118, E29.121, 257/E29.258, 278, 236, 242, 263, 341, 342, 257/401, 737, 738, 778–780, 213, E23.079
See application file for complete search history.

(56) References Cited

U.S. PATENT DOCUMENTS 5,242,841 A   9/1993   Smayling et al.
2001/0045635 A1   11/2001   Kinzer et al.
(Continued)

FOREIGN PATENT DOCUMENTS

JP   06151863   5/1994
JP   2002270814   9/2002
JP   2002353452   12/2002

OTHER PUBLICATIONS

Patent Abstracts of Japan, vol. 2003, No. 4, Apr. 2, 2003 & JP 2002 353452 A (Toshiba Corp.), Dec. 6, 2002.
(Continued)

*Primary Examiner* — Meiya Li
(74) *Attorney, Agent, or Firm* — Allen, Dyer, Doppelt, Milbrath & Gilchrist, P.A.

(57) ABSTRACT

A vertical conduction power device includes respective gate, source and drain areas formed in an epitaxial layer on a semiconductor substrate. The respective gate, source and drain metallizations are formed by a first metallization level. The gate, source and drain terminals are formed by a second metallization level. The device is configured as a set of modular areas extending parallel to each other. Each modular area has a rectangular elongate source area perimetrically surrounded by a gate area, and a drain area defined by first and second regions. The first regions of the drain extend parallel to one another and separate adjacent modular areas. The second regions of the drain area extend parallel to one another and contact ends of the first regions of the drain area.

19 Claims, 9 Drawing Sheets (51) Int. Cl.

| | |
|---|---|
| *H01L 29/06* | (2006.01) |
| *H01L 29/78* | (2006.01) |
| *H01L 29/417* | (2006.01) |
| *H01L 29/861* | (2006.01) |
| *H01L 29/732* | (2006.01) |
| *H01L 29/739* | (2006.01) |
| *H01L 21/265* | (2006.01) |
| *H01L 29/08* | (2006.01) |

(52) U.S. Cl.
CPC . 29/0692 (2013.01); *H01L 29/7809* (2013.01); *H01L 29/41708* (2013.01); *H01L 29/41716* (2013.01); *H01L 29/8611* (2013.01); *H01L 29/66272* (2013.01); *H01L 29/417* (2013.01); *H01L 29/7322* (2013.01); *H01L 29/0878* (2013.01); *H01L 29/66333* (2013.01); *H01L 29/7398* (2013.01); *H01L 29/0696* (2013.01); *H01L 29/41766* (2013.01); *H01L 29/41741* (2013.01); *H01L 29/66128* (2013.01)

USPC ........... 438/135; 438/136; 438/177; 438/284; 438/220; 438/222; 438/226; 438/245; 438/247; 257/220; 257/236; 257/278; 257/242; 257/263; 257/341; 257/342; 257/401; 257/E29.121; 257/E29.258

(56) References Cited

U.S. PATENT DOCUMENTS

| | | | |
|---|---|---|---|
| 2004/0079991 A1* | 4/2004 | Lin et al. | 257/335 |
| 2004/0113200 A1 | 6/2004 | Kobayashi et al. | |
| 2005/0077552 A1* | 4/2005 | Baiocchi et al. | 257/288 |
| 2005/0269660 A1 | 12/2005 | Singh | |

OTHER PUBLICATIONS

Patent Abstracts of Japan, vol. 018, No. 464 (E-1598), Aug. 29, 1994 & JP 06 151863 A (Oki Electric Ind. Co. Ltd.) May 31, 1994.
Patent Abstracts of Japan, vol. 2003, No. 01, Jan. 14, 2003 & JP 2002 270814 A (Sanyo Electric Co. Ltd.) Sep. 20, 2002.

* cited by examiner

|  | Invention | Prior Art | Gain |
|---|---|---|---|
| Footprint | 31 mm² | 31 mm² |  |
| Area dedicated to the MOS active part | 14.4 mm² | 25.7 mm² | -44% |
| Static characteristics | | | |
| Resistive component associated with the MOS active part considering the same technology | 0.5 mOhm | 0.3 mOhm | +78% |
| Resistive component associated with the drain current path | 1.1 mOhm | 1.5 mOhm | -47% |
| Resistive component associated with the source current path | 0.2 mOhm | 0.2 mOhm |  |
| Total Ron | 1.8 mOhm | 2.0 mOhm | -10% |
| Dynamic characteristics | | | |
| Gate charge | 108 nC | 192 nC | -44% |
| Q-factors | | | |
| Ron*Gate charge | 190 mOhm*nC | 380 mOhm*nC | -47% |
| Ron*Footprint | 56 mOhm*mm² | 62 mOhm*mm² | -10% |
| Ron*Gate charge*Footprint | 6 Ohm*nC*mm² | 12 Ohm*nC*mm² | -50% |

VERTICAL CONDUCTION POWER ELECTRONIC DEVICE AND CORRESPONDING REALIZATION METHOD

RELATED APPLICATIONS

The present application is a divisional of U.S. patent application Ser. No. 11/235,495, filed on Sep. 26, 2005, the entire contents of which are incorporated by reference.

FIELD OF THE INVENTION

The present invention relates to electronic devices, and, more particularly, to a vertical conduction electronic power device and corresponding method.

More particularly, the present invention relates to a vertical conduction electronic power device being integrated on a semiconductor substrate, comprising gate, source and drain areas, realized in an epitaxial layer on the semiconductor substrate and comprising gate, source and drain lines realized by a first metallization as well as gate, source and drain terminals determined by a second metallization, with the drain line being connected to a sinker structure realized in the epitaxial layer.

The invention relates particularly, but not exclusively, to a MOS (metal oxide semiconductor) vertical conduction power device and the following description is made with reference to this field of application for convenience of illustration only.

BACKGROUND OF THE INVENTION

As it is well known in recent years the development of power devices has been considerably accelerated under the pressure of two different factors: the increase in the functions which can be integrated in a single chip or die wherein the power device is realized; and the increasing miniaturization of electronic devices for applications on portable devices such as personal computers, mobile phones and the like.

In fact, miniaturization has been the motivation of many mass products and presently around 50% of electronic systems can be branded as "portable" and this percentage will certainly and drastically increase in next years. Miniaturization requirements obviously impact on the size and weight of these electronic devices. In particular, the highest ratio between the chip or die size and the footprint thereof moved from around 0.3 in the early nineties to around 0.8 at the end of the century.

On another hand, the continuous developments in the microprocessor technology have also led to an increase in the power device operating frequency thus increasing the speed and field of application thereof. To keep or even increase the power of electronic power devices at high operating frequencies there is the need to increase the current provided to the devices and thus the density of the power distributed on the printed circuit board whereon they are assembled. As a consequence, there is the need to provide electronic power devices with lesser and lesser both static and dynamic power losses to improve the efficiency thereof at the required frequencies.

In this context it may be very important to reduce or remove also the printed circuit board parasitic components that can add losses to the whole electronic system. In the specific case of vertical conduction power devices better performance can be obtained by reducing the device output resistance as well as the parasitic capacitances and the thermal resistance.

In fact, as it is well known, a Q-factor (FFOM) to evaluate the efficiency of a vertical conduction electronic power device is the product of the output resistance (Ron) and the device footprint. Moreover, for high frequency applications the dynamic feature represented by an electric charge value to be provided to the conduction terminal (Gate change) to turn the device on or off is important. The lower the value of the product of the three indicated factors (Ron, Footprint, Gate change), the more efficient the device is.

It is also known that vertical conduction electronic power devices are usually assembled on printed circuit boards through surface assembly methods and it is thus preferable that they have all conduction terminals on a same plane. In this perspective, methods to realize vertical conduction devices suitable to draw all conduction terminals on a same surface plane have been developed, without penalizing the three above-mentioned Q-factors and particularly the output resistance.

Figure 1:
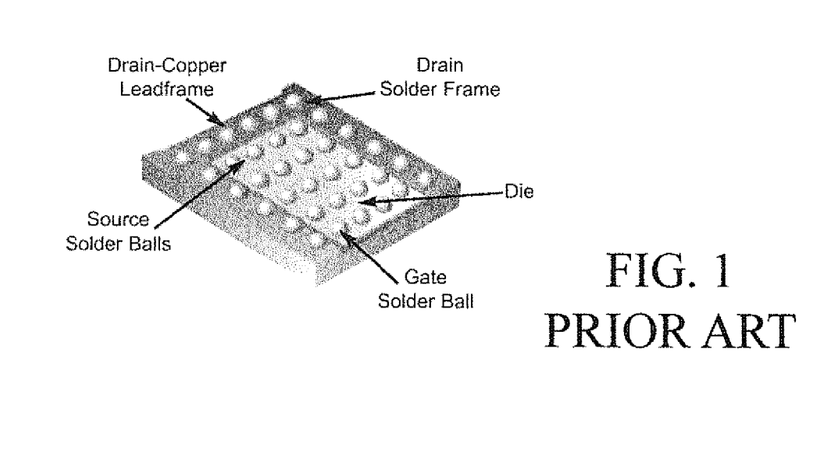
FIGS. 1, 2 and 3 schematically show embodiments of an electronic power device according to the prior art.

A first approach is represented by a power device realized by a conveniently shaped metal container or frame suitable to draw at the same level in an upper surface, the device conduction terminal (drain) located on a lower surface. An embodiment thereof is shown in FIG. 1 and described in the document MOSFET (metal oxide semiconductor field effect transistor BGA (ball grid array) design—Fairchild Semiconductor—August 2002. In this document, a method is described for realizing a power device comprising an assembly step wherein the device integrated on the semiconductor (die) is welded inside a frame through conventional so-called die attach techniques.

Although somewhat advantageous under several aspects, the approach has the drawback that the leveling of conduction terminals (source, gate) located on the device upper surface with the conduction terminal (drain) located on the opposite surface, and drawn on this surface, is ensured in the absence of the frame mechanical tolerances, of the semiconductor chip thickness as well as of the thickness of the welding compound used for the die attach technique. Therefore this approach may not be sufficiently reliable for the realization of large-scale-efficiency vertical conduction power devices.

A second known approach, commonly indicated with the term WLCSP (Wafer Level Chip Scale Package), provides for the complete removal of the metal frame by realizing a package immediately on a silicon chip, whereon a plurality of dies are integrated, before splitting the single dies. In the realization of vertical conduction devices having overlapped dies, conduction terminals are drawn on a same device surface. This approach provides the realization of deep sinkers, along the die outer perimeter, crossing the whole silicon chip thickness, which are filled with a conductive material such as a metal (for example gold).

Also this second known approach, although advantageous under several aspects, has the drawback that the current flow, coming from the terminal located in the die lower surface, can be collected only along the outer perimeter of the device upper surface. This implies that the resistive contribution due to the current flow path on the substrate is considerable. Moreover, the provided realization method is very complex and thus rarely used.

Figure 2:
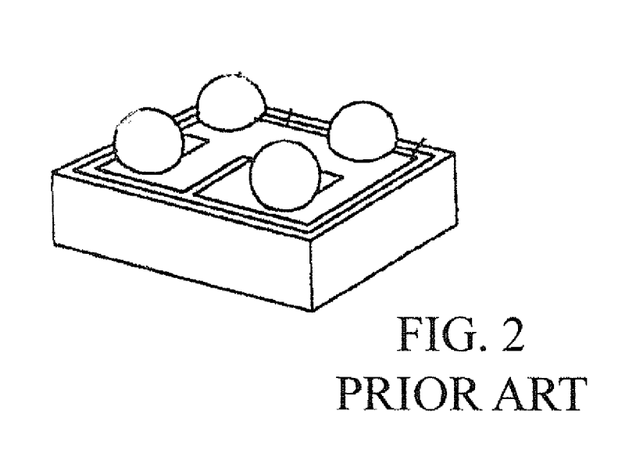

It is also known to realize a vertical conduction power device through the so-called Flip Chip BGA (Ball Grid Array) technique providing that "bumps", made of tin-based welding alloys, are positioned on the chip conduction pads, to allow the same to be directly connected on the board (FIG. 2). This technique requires that a wettable metal is arranged on the pads.

Figure 3:
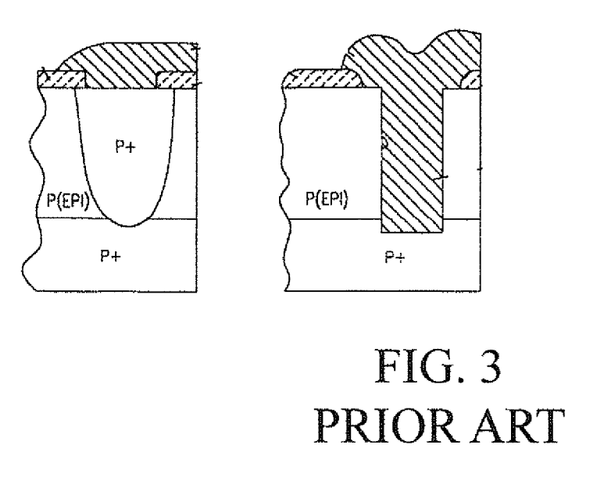
Figure 4:
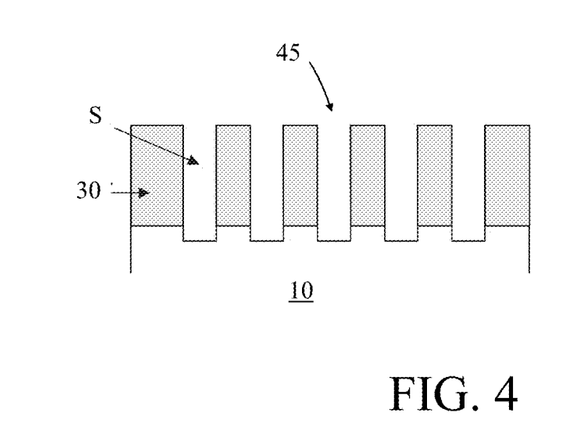
FIGS. 4 to 7 schematically show in vertical section and enlarged scale a portion of a power device in the different steps of the realization method according to the invention.
Figure 5:
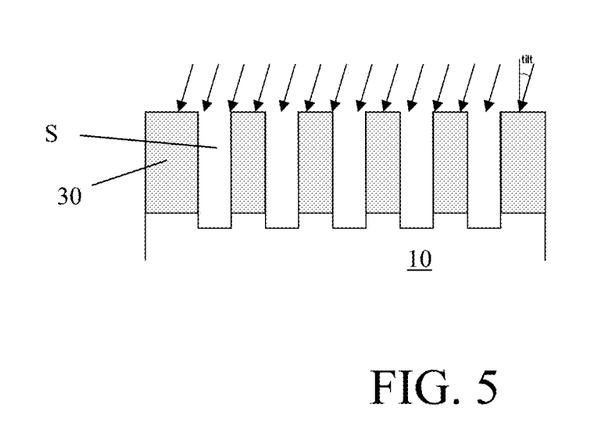
Figure 6:
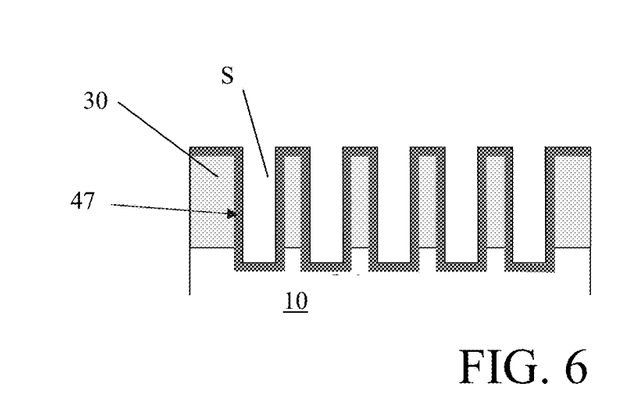
Figure 7:
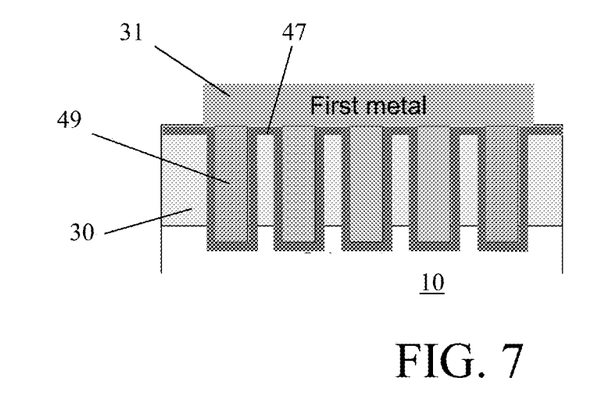

The Flip Chip BGA technique is used in US patent application no. US 2001/0045635 by Kinzer wherein the device drain is brought to the surface by deep and heavily-doped sinkers or sinkers filled with a conductive layer (metal or polysilicon) creating conductive paths between the substrate and the metallization on the device surface (FIG. 3). Sinkers are located along the device perimeter and the current flow from the die centre towards the perimeter only relies on the conductive substrate made of heavily-doped silicon.

This third known approach has however the drawback that sinkers are realized along the device perimeter and the substrate, mainly when large-sized, gives a considerable resistive contribution which, in the case of application to low-voltage electronic power devices (20, 50 Volt), has unacceptable values. Moreover in this known approach the contact area with the printed circuit board is reduced, since it is limited to the bumps.

SUMMARY OF THE INVENTION

The technical shortcoming underlying the present invention is to provide a vertical conduction electronic power device having a reduced output resistance, a low thermal resistance, a reduced size and a reduced gate change value, this device having on a same surface all conduction terminals and having such structural and functional features as to allow the drawbacks mentioned with reference to the prior art to be overcome. The present invention realizes all conduction terminals on a same device surface by a plurality of modules having an independent structure and a closed contour.

One aspect is directed to a vertical conduction electronic power device comprising a semiconductor substrate, an epitaxial layer on the semiconductor substrate, and respective gate, source and drain areas in the epitaxial layer. A first metallization level may be adjacent the epitaxial layer defining respective gate, source and drain metallizations. A second metallization level may be adjacent the first metallization level defining respective gate, source and drain terminals.

The respective gate, source and drain areas are configured as a set of modular areas extending parallel to each other. Each modular area may have a rectangular elongate source area perimetrically surrounded by a narrow gate area, and separated from each other by first parallel regions of the drain area extending parallel and connected at opposite ends thereof to a second closed region of the drain area forming a device outer peripheral edge. A sinker structure may extend perpendicularly to the semiconductor substrate, and may comprise a grid of sinkers located below both the first parallel regions and the second closed regions of the drain area to provide a conductive channel for the current coming from the source area and directed towards the drain area across the semiconductor substrate.

Another aspect is directed to a method for forming a vertical conduction electronic power device as defined above.

BRIEF DESCRIPTION OF THE DRAWINGS

The features and advantages of the vertical conduction power device and method according to the invention will be apparent from the following description of embodiments thereof given by way of non-limiting example with reference to the attached drawings.

DETAILED DESCRIPTION OF THE PREFERRED EMBODIMENTS

Figures 8, 9:
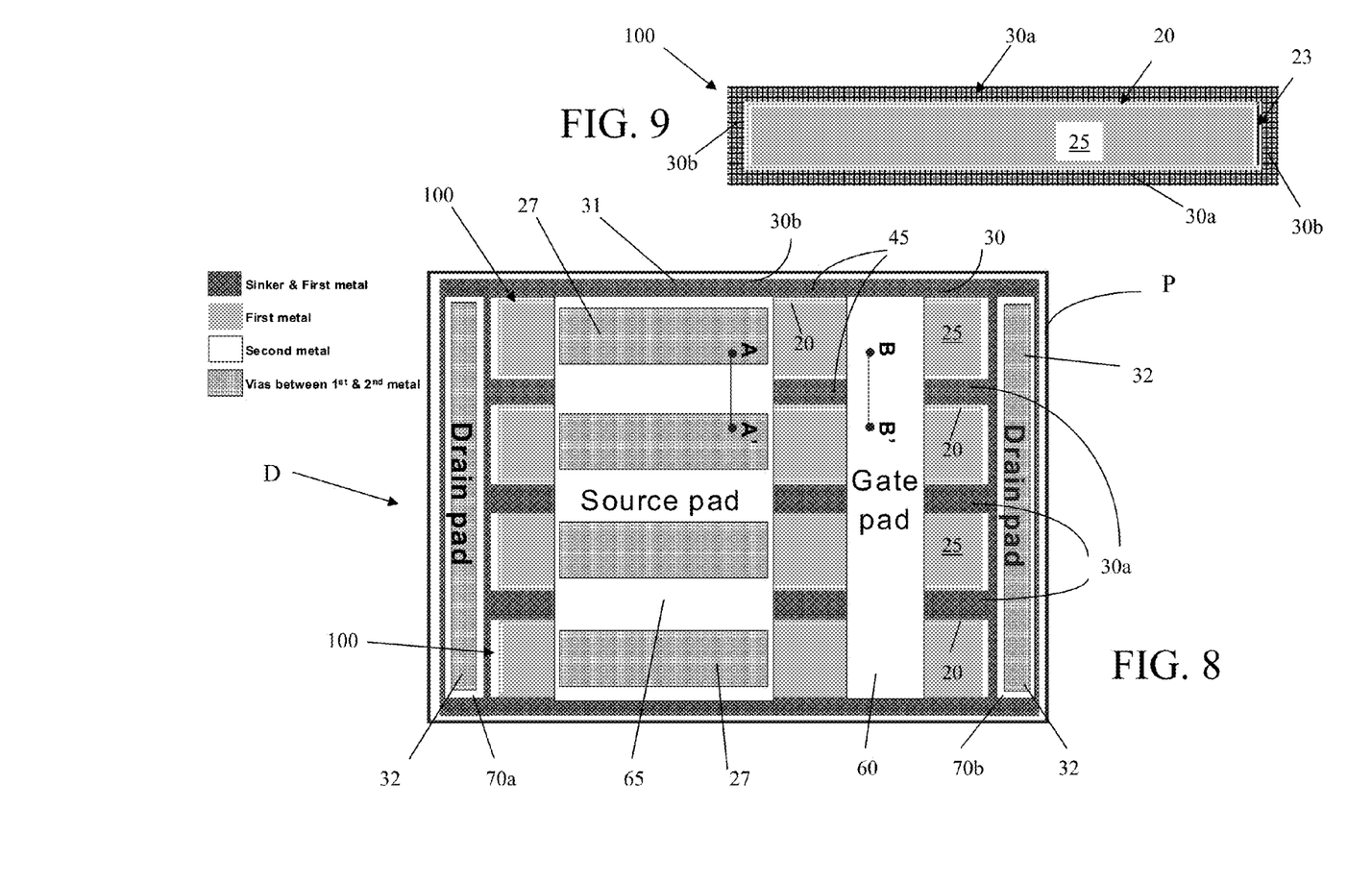
FIG. 8 is a view from above of a power device realized according to the present invention.
FIG. 9 shows an enlarged detail of the device of FIG. 8.

With reference to the figures, and particularly to the example of FIG. 8, a vertical conduction electronic power device, particularly a MOS transistor, realized according to the present invention, is globally and schematically indicated with D. The present invention will be described hereafter with reference to the realization of vertical conduction MOS power devices, but it can be advantageously applied to the realization of any vertical conduction power device such as for example BJT (Bipolar Junction Transistor), diodes, IGBT (Insulated Gate Bipolar Transistor) or power MOS both with planar structure and trench-gate.

The process steps and structures described hereafter do not form a complete process flow for producing integrated circuits. In fact, the present invention can be implemented together with the integrated circuit realization techniques presently used in this field, and only those realization steps being necessary to understand the invention will be described hereafter. Figures showing cross sections of portions of a device are not drawn to scale, but they are drawn to show the main features.

The device D, shown in FIG. 8, is configured as a set of modular areas 100 being approached to each other and extending parallel to each other. More particularly, the device D comprises a plurality of rectangular elongate source areas 25, each surrounded by a narrow gate area 20 and delimited by a closed gate contour 23, as better shown in FIG. 9.

These source areas 25, and thus gate areas 20, extend parallel to each other and they are mutually separated by a first longitudinally-extending region 30a, with drain area 30. Moreover, as particularly emphasized in FIG. 8, the device D has all along an outer perimeter P, a second closed region 30b, with a drain area 30, which substantially configures an outer edge.

Figure 10:
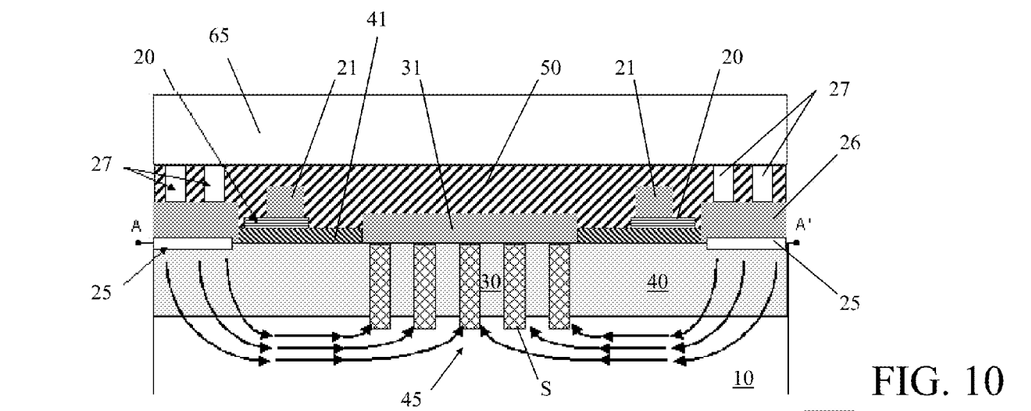
FIGS. 10 and 11 schematically show sections according to the lines A-A' and B-B' of the device of FIG. 8.
Figure 11:
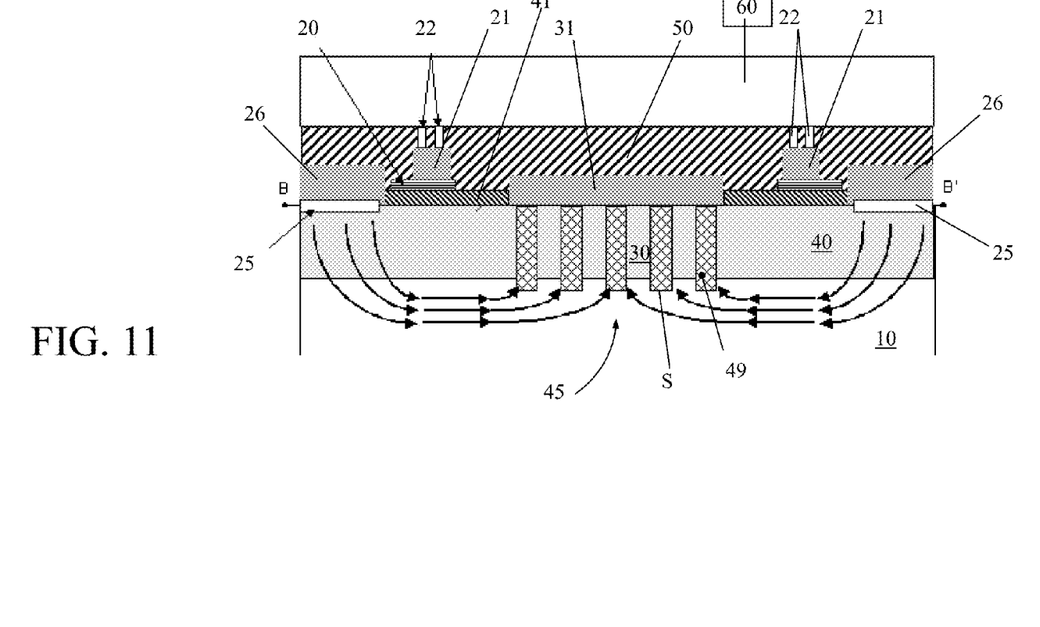

With particular reference to FIGS. 10 and 11, showing portions of the device D according to a section A-A' and a section B-B' respectively, the device D is realized on a semiconductor material substrate 10, while the source 25, gate 20 and drain 30 areas are realized in an epitaxial layer 40 arranged on the substrate 10.

In the epitaxial layer 40 in correspondence with the drain areas 30, both below the first regions 30a and the second closed region 30b, the device D comprises a sinker structure 45, created by realizing a quite dense grid of sinkers S. Advantageously a portion of this sinker structure 45 underlying two first adjacent regions 30a and corresponding portions of second peripheral regions 30b, is arranged perimetrically to each modular area 100 defining the device D.

Substantially, the device D is configured as a set of modular areas 100 extending parallel to each other, each having a rectangular elongate source area 25 surrounded by a narrow gate area 20, delimited by a closed contour 23, and separated from each other by regions 30a with the drain area 30 extending parallel and connected at the opposite ends thereof to a second closed region 30b with the drain area 30 forming a device outer peripheral edge; as well as a sinker structure 45 extending perpendicularly to the substrate and formed by a grid of sinkers S located below both the first parallel regions 30a and the second closed region 30b with the drain area 30 to favor a conductive channel for a current coming from the source area 25 and directed towards the drain area 30 across the substrate 10.

Advantageously, as emphasized in FIGS. 10 and 11, each sinker S is deeper than the thickness of the epitaxial layer 40 and such as to penetrate at least partially the substrate 10. Each sinker S thus allows a conductive channel to be realized for the current in the substrate 10, coming from the source area 25 and directed towards the drain area 30 of each modular area 100.

Figure 12:
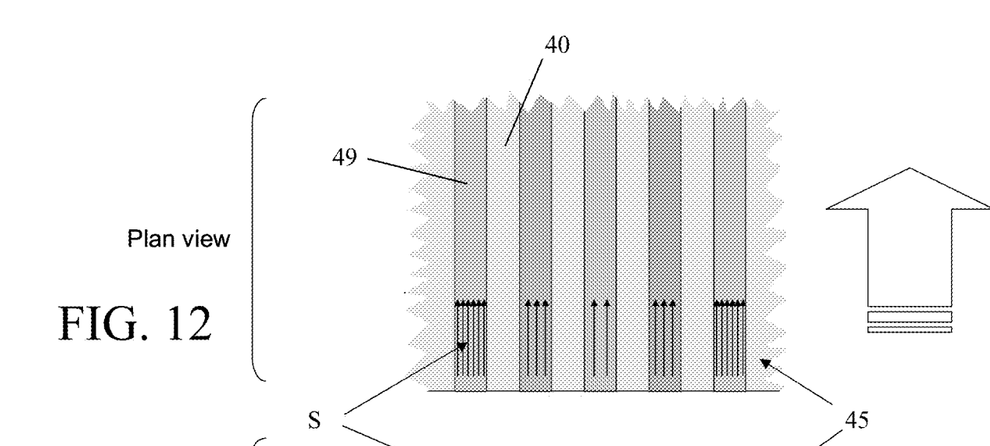
FIGS. 12 to 17 are views from above and sectional views respectively of different embodiments of sinker ducts according to the invention.
Figure 13:
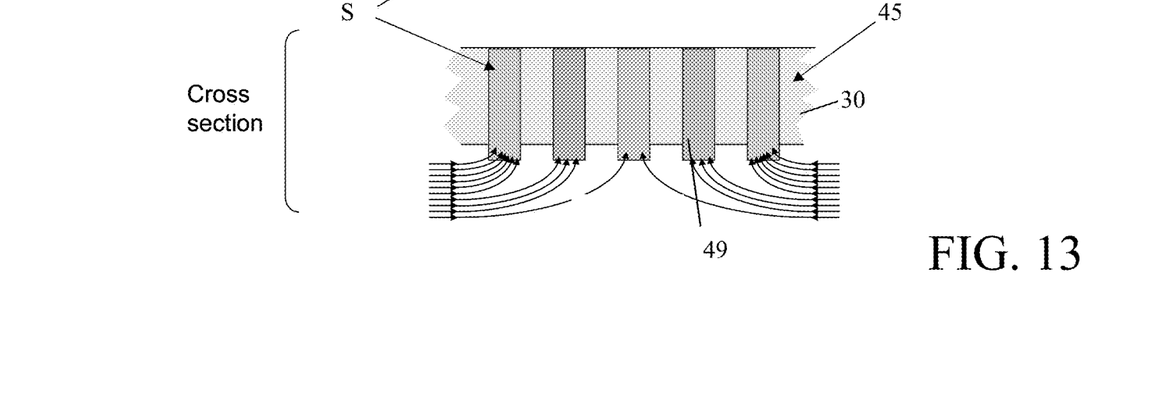

As emphasized in FIGS. 4 to 7, each sinker S has, near the walls, a layer 47 of enriched material allowing the contact resistance of the sinker S to be improved. Moreover a metal 49, such as for example a tungsten plug, is deposited all along the useful depth as emphasized in FIGS. 7, 12 and 13.

With reference to FIGS. 10 and 11, respective gate metallization or metal strips 21, realized by sputtering, are provided on each gate area 20 to allow the electrical connection thereof. Similarly, further metallization or metal strips 26 and 31 are provided on each source 25 and drain 30 area respectively, in the latter case both on the first regions 30a and the second regions 30b.

A dielectric layer 50, arranged on the whole upper surface of the device D, has such a thickness as to completely cover metallization strips 21, 26 and 31. Conveniently, the dielectric layer 50 has a plurality of gate 22, source 27 and drain 32 via contacts, the latter being visible only in FIG. 8, respectively obtained through openings realized by photolithography on the first metallization or metal level 21, 26 and 31 and thus on the gate 20, source 25 and drain 30 areas, so as to allow an electric communication. Particularly, in each rectangular elongate modular area 100, source vias 27 occupy a substantially central portion, gate vias 22 occupy a portion arranged laterally and outside source vias 27, and drain vias 32 occupy the two transverse opposite ends of each modular area 100.

Advantageously, the device D has on the dielectric layer 50 a source terminal or electrode or pad 65, a gate pad 60 and a pair of drain pads 70a and 70b, the same, with a substantially rectangular structure, being arranged parallel to each other and transversely to the device D and thus also to each modular area 100.

In particular, according to a preferred embodiment, each pad of the pair of drain pads 70a and 70b is arranged near the transverse ends of the outer perimeter P of the device D, and the source 65 and gate 60 pads are arranged inside the pair of drain pads 70a and 70b and parallel to each other.

Conveniently, the source 65, gate 60 pads and the pair of drain pads 70a and 70b are obtained through a photolithography on a second metallization realized on the whole dielectric layer 50 of the device D. The second metallization being obtained by sputtering by using some wettable material from the traditional welding compounds used in electronics.

The source 65, and gate 60 pads and the pair of drain pads 70a and 70b are realized on the gate 22, source 27 and drain 32 vias, on a second metallization level, allowing the electric connection. In particular, the pair of drain pads 70a and 70b, arranged on drain vias 32, allows the current in the substrate 10 coming from the source area 25 and directed towards the drain area 30 for each modular area 100 to be brought to the surface. The current is thus caught not only by the sinker structure 45 on the outer perimeter P of the device D below the second region 30b, but also by the sinker structure 45 in each first region 30a interposed between a modular area 100 and the other on the whole longitudinal length of the device D.

The presence of the sinker structure 45 thus allows the functionality and efficiency of the device D to be considerably improved minimizing the resistive contribution due to the reduced path of the current because of the sinker structure 45 itself in each modular area 100. Moreover, the presence of the sinker structure 45 and of the drain vias 32 in correspondence with the outer perimeter P allows an excellent operation of the device D to be ensured during the interdiction step.

To complete the so-obtained device D, the semiconductor substrate 10 can be conveniently reduced and the device D can have a metal bottom, not shown in the figures since it is conventional. It is worth noting that FIG. 8 shows the source 27 and drain 32 vias, but not gate vias 22 only for clarity of explanation. Moreover, the device D is shown by considering the surface dielectric layer 50 to be transparent, to show the details of underlying layers.

The invention also relates to a realization method of a vertical conduction electronic power device and it is shown hereafter with reference to FIGS. 4 to 11. The realized power device is the one represented in FIG. 8 and the same reference numerals will be used hereafter to indicate corresponding parts.

The realization method according to the invention provides the following steps: growing an epitaxial layer 40 on a semiconductor substrate 10; and realizing respective gate 20, source 25 and drain 30 areas in that epitaxial layer 40.

Advantageously, the realization steps of the drain 30, gate 20 and source 25 areas comply with a layout shown in FIG. 8 according to which the device D is configured as a set of modular areas 100 being adjacent to each other and extending parallelly. More particularly, the device D comprises a plurality of rectangular source areas 25, each surrounded by a narrow gate area 20, delimited by a gate contour 23, and each separated from one another by a first longitudinally-extending region 30a, with the drain area 30. Moreover the device D has all along an outer perimeter P, a second closed region 30b, with the drain area 30.

The method further provides the steps of: depositing a thin layer of dielectric material, for example a 0.5 um-thick oxide, on the epitaxial layer 40, not shown in the figures, and eventually performing a dielectric thickening thermal process; opening the contacts in correspondence with the body, gate and source areas; and realizing through photolithography, in correspondence with the drain area 30, and also in correspondence with the first regions 30a and the second region 30b, a sinker structure 45 realizing a quite dense grid of sinkers S being parallel to each other and structurally independent.

Advantageously, the photolithographic step realizes each sinker S of the sinker structure 45 with a higher depth than the thickness of the epitaxial layer 40 and such as to penetrate at least partially the substrate 10. In a preferred embodiment, each sinker S is deeper than (3-10) um and the width thereof ranges between 0.6 and 1 um.

The realization method according to the invention also provides the steps of: performing, as shown in FIGS. 4 to 7, an enrichment implant on the sinker structure 45 allowing the contact resistance to be improved. Preferably the enrichment implant occurs according to the following features phosphous (P) of $1E15/cm^2$ at 30 KeV and it is performed with a tilt angle varying from +7° to −7° to allow both side walls of each sinker S to be implanted for the whole depth improving the implant efficiency; eventually performing an annealing process; and depositing a first metal barrier, not emphasized in the figures, for example by an alloy of Ti/TiN, and eventually performing a silicidation, as for example the device subjected for 30 sec. at 80° C. The method may further include filling all the previously opened contacts and the sinkers S of the sinker structure 45 for the whole depth thereof with a conductive material 49, particularly a metal one, such as for example a 0.3-0.7 um-thick tungsten plug (W-plug); performing an etch back step of the conductive material 49; depositing a second metal barrier layer preferably by for example of 0.1 μm of Ti, not shown in the figures; realizing by sputtering a first metallization, preferably by using AlSiCu with a thickness from 0.5 um to 3 um; and realizing through photolithography on the first metallization and on the metal barrier layer convenient gate 21, source 26 and drain 31 metallizations in each modular area 100 which, overlapping respective gate 20, source 25 and drain 30 areas, define convenient closed contour structures. The method may further include performing an alloy thermal process; depositing a dielectric layer 50 with such a thickness as to completely overhang gate 21, source 26 and drain 31 metallizations, for example by using 1 um of oxide; realizing through a photolithographic step on the dielectric layer 50 a plurality of contact vias for the source 27, gate 22 and drain 32 regions to open connection vias with the gate 20, source 25 and drain 30 metallizations.

Advantageously, the source 27, gate 22 and drain 32 vias will occupy transverse areas of each modular area 100. In particular, the source 27 vias will occupy a substantially central area of each modular area 100, gate 22 vias will occupy a portion arranged laterally to source vias 27 and drain vias 32 will occupy the two transverse ends of each modular area 100.

The realization method thus provides to continue with the following: performing a second metallization by sputtering, using a material being conveniently wettable by traditional welding compounds, preferably Ti/Ni/Au or Ti/NiAg; performing a photolithographic step of the second metallization defining on the source 27, gate 22 and drain 32 vias corresponding source 65, gate 60 electrodes or pads and a pair of drain electrodes 70a and 70b, which will be arranged transversely to each modular area 100; traditionally completing the device D by eventually realizing a reduction of the semiconductor substrate 10 and eventually inserting a metal bottom.

The realization method according to the invention allows a vertical conduction power device D to be realized having the three conduction terminals brought on the same device surface, the arrangement being obtained by a synergy between the device layout and the process sequence.

Figure 14:
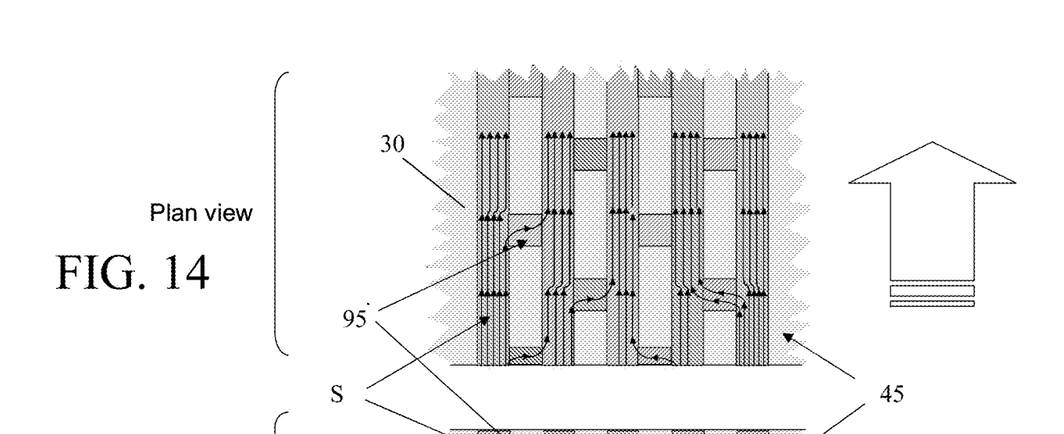
Figure 15:
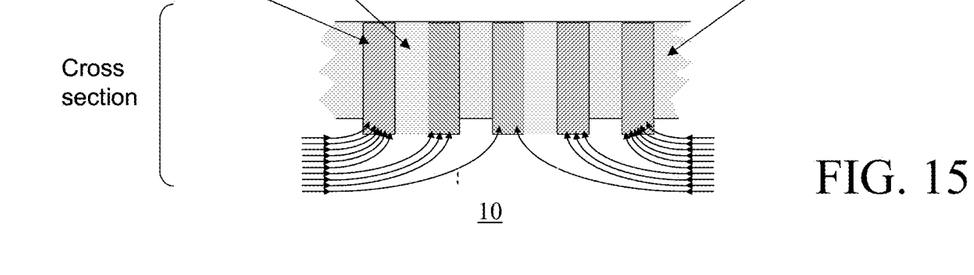

It is also possible to envisage alternative embodiments of the vertical conduction power device according to the invention. As shown in FIGS. 14 and 15 a first alternative embodiment emphasizes a possible approach for a second embodiment of the sinker structure 45. Preferably in this approach the sinker structure 45 has a plurality of connection ducts 95 between sinkers S being plan parallely arranged, allowing the flowing current distribution, coming from the source area and directed towards the drain area. The plurality of ducts 95 can be realized by a convenient mask during the photolithographic step.

Figures 16, 17:
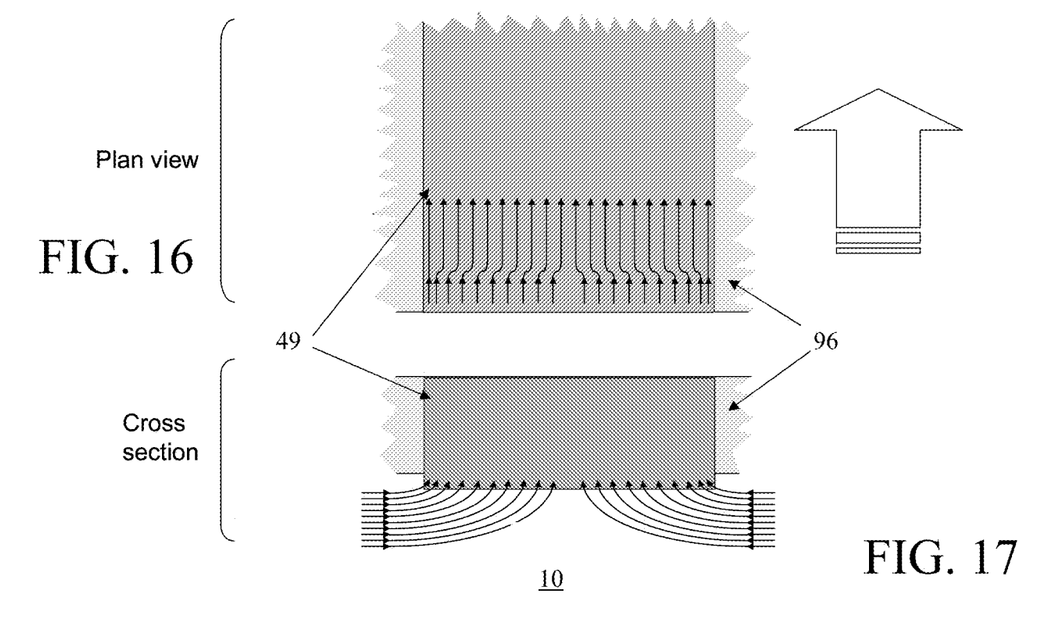

A further embodiment of the vertical conduction power device D provides, in correspondence with the drain area, a single trench 96, realized as an alternative to single sinkers S of the sinker structure 45, as indicated in FIGS. 16 and 17. The trench 96 occupies the whole available area and it is filled by the high conductivity material 49 as indicated in FIG. 17 allowing the current to flow from the source to the drain.

The main advantage of the vertical conduction power device is to bring on a same surface the source, gate electrodes and the drain electrode by a particular device layout arrangement. A further advantage of the device is to obtain with the particular layout arrangement a plurality of juxtaposed structurally-independent modules, each one having a source, gate metallization and a drain metallization realized in correspondence with the closed contour.

The presence of the sinker structure is also advantageous, which, realized in correspondence with the drain area, is arranged on the perimeter of each modular area and on the device outer edge, thus ensuring an excellent device operation in the interdiction step.

A further advantage of the device is that the sinker structure created by realizing a quite dense grid of sinkers without excessively penalizing the active area minimizes the resistive contribution due to the current path on the substrate and it thus reduces the device output resistance.

Another advantage of the so-realized device is that the reduced size of each sinker facilitates and simplifies the filling thereof with a high conductivity metal layer.

The size of contact terminals is also advantageous for the device, in fact they have a contact area with the board being much larger than the size of previous devices and this generates significant advantages on the resistive contribution.

Figure 18:
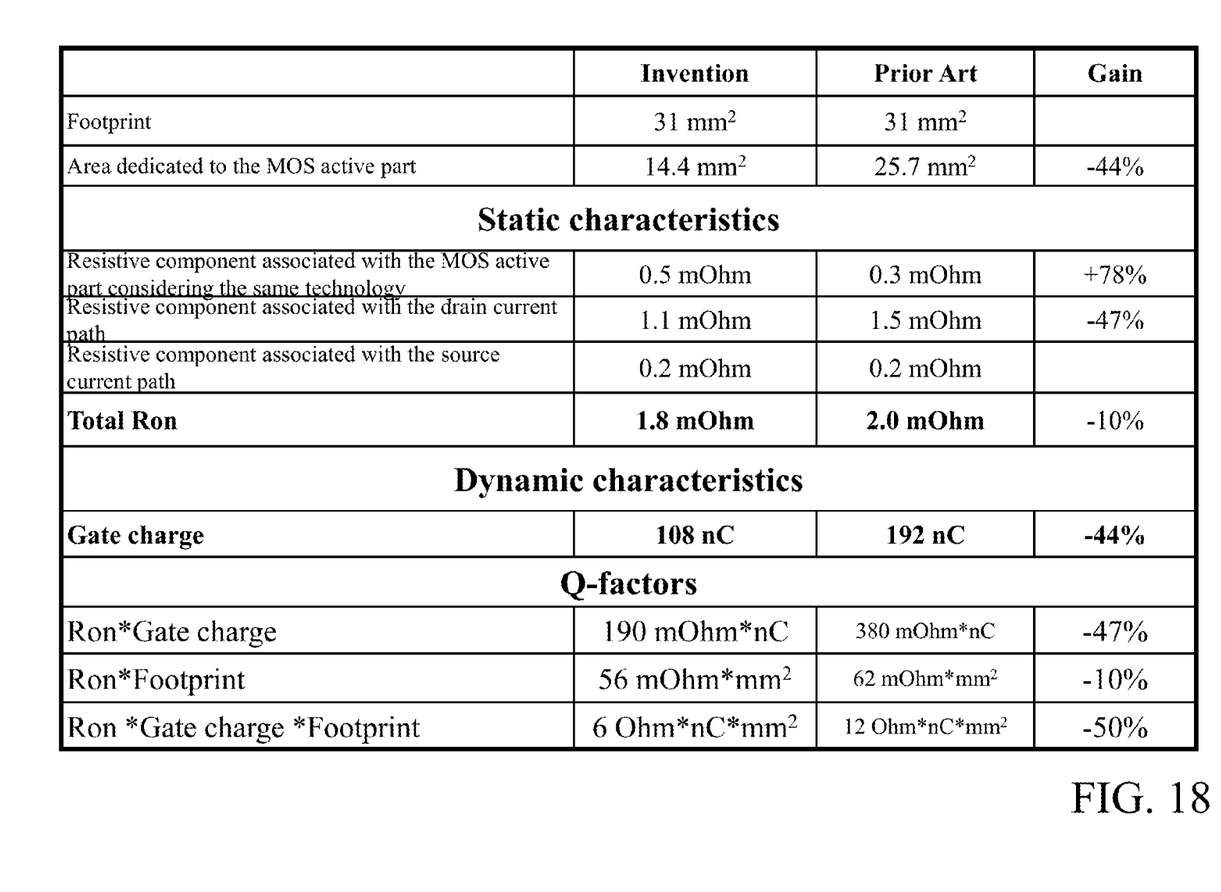
FIGS. 18 and 19 show the values of some significant Q-features between devices realized according to the prior art and to the present invention as a table and graphically.

From experimental tests carried out by the Applicant it was possible to verify that the so-obtained device, although the presence of the sinker structure limits the possibility to exploit the whole semiconductor layer, has a gain on the resistive contributions of the drain terminal resulting in an advantage of the device in the dynamic operation thereof, as it can be seen in the table of FIG. 18.

Figure 19:
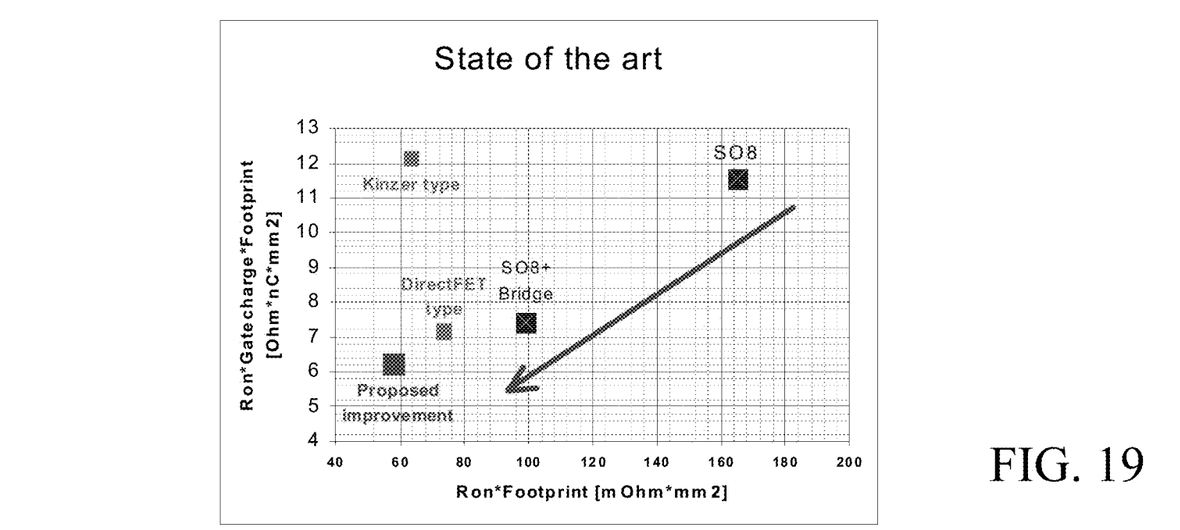

From experimental tests carried out by the Applicant it is possible to verify that the device has an extremely reduced product between the output resistance, the Gate change and the Footprint, as it can be seen from the comparison diagram in FIG. 19. Last but not least, the device has a simple, efficient and reduced-cost process sequence.

That which is claimed is:

1. A method for forming an electronic device comprising:
    forming an epitaxial layer on a substrate;
    forming respective gate, source and drain areas in the epitaxial layer;
    forming a first metallization level adjacent the epitaxial layer defining respective gate, source and drain metallizations for the gate, source and drain areas;
    forming a second metallization level adjacent the first metallization level defining respective gate, source and drain terminals for the gate, source and drain metallizations;
    the respective gate, source and drain areas being formed as a set of modular areas extending parallel to each other, each modular area having a source area with a rectangular elongate shape, the source area perimetrically surrounded by the gate area and the drain area, the drain area being defined by first regions and second regions, the first regions of the drain area extending parallel to one another and separating adjacent one of the modular areas, and the second regions of the drain area extending parallel to one another and contacting ends of the first regions of the drain area; and
    forming a sinker structure extending perpendicularly to the substrate and comprising a grid of sinkers located directly below both the first regions and the second regions of the drain area.

2. The method according to claim 1, wherein the drain area and the source area are separated by the gate area in the adjacent one of the modular areas.

3. The method according to claim 1, wherein each modular area is delimited on long sides of the electronic device by the first regions of the drain area and on short sides of the electronic device by the second regions of the drain area.

4. The method according to claim 1, wherein the gate area of each modular area is delimited by a closed gate contour.

5. The method according to claim 1, wherein the sinker structure has a depth that is greater than a thickness of the epitaxial layer for penetrating at least partially into the substrate.

6. The method according to claim 1, wherein each sinker comprises peripheral walls and an enriched material layer on the peripheral walls.

7. The method according to claim 1, wherein each of the gate, source and drain metallizations formed by the first metallization level on the gate, source and drain areas in each module area has a closed contour.

8. The method according to claim 7, further comprising:
forming a dielectric layer on the gate, source and drain metallizations; and
forming a plurality of source, gate and drain contact vias extending through the dielectric layer, the source vias occupying a substantially central portion, the gate vias occupying a portion arranged laterally and outside the source vias, and the drain vias partially occupying the closed contour.

9. The method according to claim 1, wherein the source, gate and drain terminals are coplanar.

10. A method for forming an electronic device comprising:
growing an epitaxial layer on a semiconductor substrate;
forming respective gate, source and drain areas in the epitaxial layer;
the respective gate, source and drain areas being formed as a set of modular areas extending parallel to each other, each modular area having the source area with a rectangular elongate shape, and the source area perimetrically surrounded by the gate area and the drain area, the drain area being defined by first regions and second regions, the first regions of the drain area extending parallel to one another and separating adjacent one of the modular areas, and the second regions of the drain area extending parallel to one another and contacting ends of the first regions of the drain area; and
forming a sinker structure in the epitaxial layer and located directly below both the first regions and second regions of the drain area.

11. The method according to claim 10, further comprising:
depositing a layer of dielectric material on the epitaxial layer;
opening contacts in correspondence with the gate area and source area;
forming through a first photolithographic step the sinker structure comprising a grid of sinkers below the drain area, each sinker having a depth greater than a thickness of the epitaxial layer for penetrating at least partially into the semiconductor substrate.

12. The method according to claim 11, wherein each sinker comprises sidewalls, the method further comprising:
performing an enrichment implant on the sidewalls of each sinker;
performing an annealing process;
depositing a first barrier on the sidewalls of each sinker using an alloy comprising Ti/TiN, and performing a silicidation step; and
filling between the sinkers with a conductive material comprising a tungsten plug.

13. The method according to claim 12, further comprising:
performing an etch back step of the conductive material;
depositing a second barrier layer;
forming by sputtering a first metallization; and
forming through a second photolithographic step on the first metallization and on the first barrier layer respective gate, source and drain metallizations in each module area overlapping the respective gate, source and drain areas for defining closed contour structures.

14. The method according to claim 13, further comprising:
performing an alloy thermal process;
depositing a second dielectric material layer with such a thickness as to completely overhang the gate, source and drain metallizations; and
forming through a third photolithographic step a plurality of source, gate and drain vias allowing connection the source, gate and drain vias to be opened with the first metallization, the source, gate and drain vias realized on each module area in correspondence with the source, gate and drain metallizations occupying transverse areas of the module areas, the source vias occupying a substantially central area of the module areas, the gate vias occupying an area arranged laterally to the source vias, and the drain vias occupying the two ends on the closed contour.

15. The method according to claim 12, wherein the enrichment implant occurs at an implant of phosphorous (P) of $1E15/cm^2$ at 30 KeV, and at a tilt angle varying from $+7°$ to $-7°$.

16. The method according to claim 11, further comprising:
performing a second metallization by sputtering using a material being wettable by welding compounds; and
performing a second photolithographic step of the second metallization for difinfing on the source, gate and drain viaz corresponding source, gate and drain electrodes arranged transversely to each module area.

17. A method for making an electronic device comprising:
forming respective source, gate and drain areas in an epitaxial layer;
the respective gate, source and drain areas being formed as a set of modular areas extending parallel to each other, each modular area having the source area with a rectangular elongate shape, and the source area perimetrically surrounded by the gate area and the drain area, the drain area being defined by first regions and second regions, the first regions of the drain area extending parallel to one another and separating adjacent one of the modular areas, and the second regions of the drain area extending parallel to one another and contacting ends of the first regions of the drain area; and
forming a sinker structure in the epitaxial layer and located directly below both the first regions and second regions of the drain area.

18. The method according to claim 17, further comprising:
forming the epitaxial layer on a semiconductor substrate;
depositing a layer of dielectric material on the epitaxial layer;
opening contacts in correspondence with the gate area and source area;
forming through a first photolithographic step the sinker structure comprising a grid of sinkers below the drain area, each sinker having a depth greater than a thickness of the epitaxial layer for penetrating at least partially into the semiconductor substrate.

19. The method according to claim 18, further comprising:
performing an enrichment implant on sidewalls of the sinker structure;
performing an annealing process;
depositing a first barrier on sidewalls of the sinker structure using an alloy comprising Ti/TiN, and persorming a silicidation step; and
filling the sinkers of the sinker structure with a conductive material comprising a tungsten plug.

* * * * *

UNITED STATES PATENT AND TRADEMARK OFFICE
CERTIFICATE OF CORRECTION

PATENT NO.        : 8,895,370 B2
APPLICATION NO.   : 14/042041
DATED             : November 25, 2014
INVENTOR(S)       : Frisina et al.

Page 1 of 1

It is certified that error appears in the above-identified patent and that said Letters Patent is hereby corrected as shown below:

In the Claims

| | |
|---|---|
| Column 10, Line 10 Claim 14 | Insert: --to-- between "connection" and "the" |
| Column 10, Line 27 Claim 16 | Delete: "definfing"<br>Insert: --defining-- |
| Column 10, Line 28 Claim 16 | Delete: "viaz"<br>Insert: --vias-- |

Signed and Sealed this
Fourth Day of August, 2015

Michelle K. Lee
*Director of the United States Patent and Trademark Office*